(12) United States Patent
Yu et al.

(10) Patent No.: US 6,495,422 B1
(45) Date of Patent: Dec. 17, 2002

(54) METHODS OF FORMING HIGH-K GATE DIELECTRICS AND I/O GATE OXIDES FOR ADVANCED LOGIC APPLICATION

(75) Inventors: Mo-Chiun Yu, Taipei (TW); Shih-Chang Chen, Taoyuan (TW)

(73) Assignee: Taiwan Semiconductor Manfacturing Company, Hsin-Chu (TW)

( * ) Notice: Subject to any disclaimer, the term of this patent is extended or adjusted under 35 U.S.C. 154(b) by 0 days.

(21) Appl. No.: 10/035,552

(22) Filed: Nov. 9, 2001

(51) Int. Cl.[7] ............... H01L 21/8234; H01L 21/8238; H01L 21/336
(52) U.S. Cl. ............... 438/275; 438/197; 438/199
(58) Field of Search ............... 438/197, 199, 438/151, 275, 286, 287, 296, 584, 592, 785, 787, 581

(56) References Cited

U.S. PATENT DOCUMENTS

| | | | |
|---|---|---|---|
| 5,639,316 A | 6/1997 | Cabral, Jr. et al. | 148/277 |
| 5,960,289 A | 9/1999 | Tsui et al. | 438/275 |
| 6,027,961 A * | 2/2000 | Maiti et al. | 438/199 |
| 6,027,977 A | 2/2000 | Mogami | 438/287 |
| 6,100,120 A | 8/2000 | Yu | 438/151 |
| 6,114,258 A | 9/2000 | Miner et al. | 438/787 |
| 6,184,072 B1 | 2/2001 | Kaushik et al. | 438/197 |
| 6,204,203 B1 | 3/2001 | Narwankar et al. | 438/785 |
| 6,228,721 B1 * | 5/2001 | Yu | 438/275 |
| 6,255,698 B1 * | 7/2001 | Gardner et al. | 257/369 |

OTHER PUBLICATIONS

"Device and Reliability of High–K Al$_2$O$_3$ Gate Dielectric with Good Mobility and Low Dit", by Chin et al., 1999 Symposium on VLSI Technology Digest of Technical Papers, pp. 135–136.

* cited by examiner

*Primary Examiner*—John F. Niebling
*Assistant Examiner*—Walter L. Lindsay, Jr.
(74) *Attorney, Agent, or Firm*—George O. Saile; Stephen B. Ackerman; Stephen G. Stanton

(57) ABSTRACT

A method of simultaneously forming a high-k metal oxide dielectric layer and a gate oxide dielectric layer comprising the following steps. A structure having isolation regions which separate the structure into at least one core device active region and one I/O active region is provided. A buffer layer is formed over the structure and the isolation regions. A metal containing layer is formed over the buffer layer. The metal containing layer and the buffer layer are patterned to: form an exposed patterned metal containing layer within the at least one core device action region; and expose the structure within the at least one I/O active region. The exposed patterned metal containing layer and the exposed structure within the at least one I/O active region are oxidized to simultaneously form: the high-k metal oxide dielectric layer within the at least one core device active region; and the gate oxide dielectric layer within the at least one I/O active region.

44 Claims, 2 Drawing Sheets

METHODS OF FORMING HIGH-K GATE DIELECTRICS AND I/O GATE OXIDES FOR ADVANCED LOGIC APPLICATION

FIELD OF THE INVENTION

"The present invention relates generally to semiconductor fabrication and more specifically to methods of forming high-k gate dielectrics and I/O gate oxides for advanced logic application."

BACKGROUND OF THE INVENTION

For deep sub-micron complimentary metal oxide semiconductor (CMOS) technology, gate oxides have been scaled down aggressively toward direct tunneling region. For ultra-thin $SiO_2$ gate oxide, leakage current will increase tremendously as gate oxide thicknesses are reduced. This will cause large standby power consumption thus making such products commercially unacceptable.

To solve this issue, different high dielectric constant (high-k) materials have been proposed to replace $SiO_2$ as the gate oxide because of leakage current reduction ability.

U.S. Pat. No. 6,184,072 B1 to Kaushik et al. describes various silicon oxynitride (or oxide) and metal oxide high-k gate dielectric layers.

U.S. Pat. No. 6,100,120 to Yu describes a metal oxide dielectric layer and process.

U.S. Pat. No. 5,639,316 to Cabral, Jr. et al. describes a method of protecting a refractory metal from oxidation during high temperature annealing.

U.S. Pat. No. 6,027,977 to Mogami describes a method of fabricating a semiconductor device with a metal insulator semiconductor (MIS) structure.

U.S. Pat. No. 5,960,289 to Tsui et al. describes a method for making a dual-thickness gate oxide layer using a nitride/oxide composite region.

U.S. Pat. No. 6,204,203 B1 to Narwankar et al. describes a method of forming a metal oxide dielectric film.

U.S. Pat. No. 6,114,258 to Miner et al. describes a method of oxidizing a substrate in the presence of nitride and oxynitride films.

The article entitled "Device and Reliability of High-K $Al_2O_3$ Gate Dielectric with Good Mobility and Low $D_{it}$", 1999 Symposium on VLSI Technology Digest of Technical Papers, pages 135 and 136, describes a process to fabricate $Al_{23}$ gate dielectric having a dielectric constant k of form 9.0 to 9.8 that is greater than the dielectric constant of $Si_3N_4$.

SUMMARY OF THE INVENTION

Accordingly, it is an object of an embodiment of the present invention to provide an improved method of forming high-k gate dielectrics and gate oxides.

Other objects will appear hereinafter.

It has now been discovered that the above and other objects of the present invention may be accomplished in the following manner. Specifically, a structure having isolation regions which separate the structure into at least one core device active region and one I/O active region is provided. A buffer layer is formed over the structure and the isolation regions. A metal containing layer is formed over the buffer layer. The metal containing layer and the buffer layer are patterned to: form an exposed patterned metal containing layer within the at least one core device action region ; and expose the structure within the at least one I/O active region. The exposed patterned metal containing layer and the exposed structure within the at least one I/O active region are oxidized to simultaneously form: the high-k metal oxide dielectric layer within the at least one core device active region; and the gate oxide dielectric layer within the at least one I/O active region.

BRIEF DESCRIPTION OF THE DRAWINGS

The present invention will be more clearly understood from the following description taken in conjunction with the accompanying drawings in which like reference numerals designate similar or corresponding elements, regions and portions and in which.

DETAILED DESCRIPTION OF THE PREFERRED EMBODIMENT

Unless otherwise specified, all structures, layers, steps, methods, etc. may be formed or accomplished by conventional steps or methods known in the prior art.

A high-k dielectric layer has a dielectric constant (k) greater than 3.9.

Initial Structure

Figure 1:
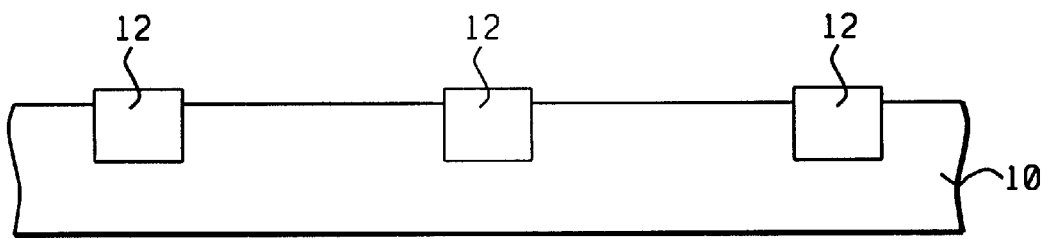
FIGS. 1 to 6 schematically illustrate a preferred embodiment of the present invention with FIGS. 3A and 3B illustrating alternate embodiments.

FIG. 1 illustrates a structure 10 with isolation regions 12 that divide structure 10 into a plurality of active regions. The portions of structure 10 between the isolation regions 12 are active regions.

Structure 10 is preferably a silicon substrate and isolation regions 12 are preferably shallow trench isolation (STI) structures and field oxidation may also be used to divide structure 10 into various active regions.

Formation of Buffer Layer 14

Figure 2:
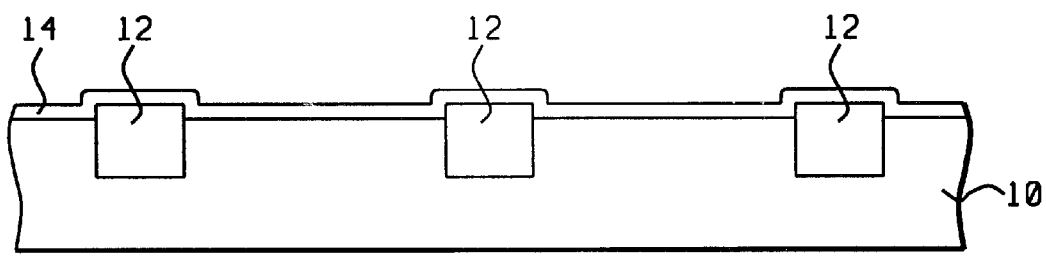

As shown in FIG. 2, a buffer layer 14 is formed over silicon substrate 10 and isolation regions 12. Buffer layer 14 is preferably comprised of a thin layer of silicon nitride ($Si_3N_4$ or just SiN) or silicon oxynitride (SiON) grown by nitridizing the silicon substrate surface with $NH_3$ or $NO/N_2O$ with rapid thermal processing (RTP). Buffer layer 14 has a thickness of preferably from about 4 to 6 Å and more preferably about 5 Å. Buffer layer 14 will prevent metal diffusion into the silicon substrate 10.

Formation of Metal Containing Layer 16 Over Buffer Layer 14

Figure 3A:
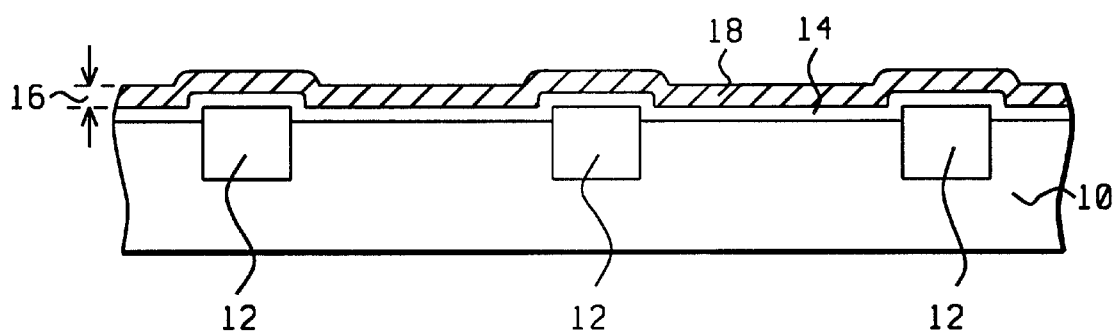
Figure 3B:
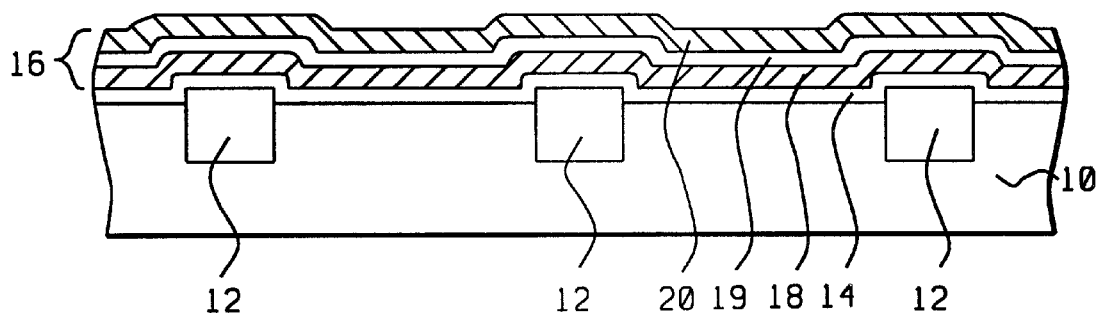

As shown in FIGS. 3A and 3B are alternate embodiments of the formation of metal containing layer 16 over buffer layer 14.

I. First Embodiment—Formation of Refractory Metal Layer 18 Over Buffer Layer 14

FIG. 3A illustrates the first embodiment in the formation of the metal containing layer 16 wherein a refractory metal layer 18 is formed over buffer layer 14 to a thickness of preferably from about 10 to 100 Å and more preferably from about 10 to 40 Å. Refractory metal layer 18 is preferably comprised of Ta, Zr, Hf or W and is more preferably comprised of Ta, Zr or Hf.

II. Alternate Embodiment—Formation of Refractory Metal 18/SiN layer 19/Second Metal Layer 20 Stack 16 Over Buffer Layer 14

FIG. 3B illustrates an alternate embodiment in the formation of the metal containing layer 16 wherein the refractory metal layer 18 of the above-described first embodiment is formed over buffer layer 14.

An optional thin SiN layer 19 may then be formed over the refractory metal layer 18 by chemical vapor deposition (CVD) to a thickness of preferably from about 5 to 20 Å and more preferably from about 5 to 10 Å.

A second metal layer 20 is then formed over either refractory metal layer 18 or, if used, the optional thin SiN layer 19 to a thickness of preferably from about 10 to 50 Å and more preferably from about 10 to 20 Å. Second metal layer 20 is preferably comprised of Al, Cu, Au or Ti and is more preferably comprised of Al.

In this alternate embodiment illustrated in FIG. 3B, the refractory metal layer 18/second metal layer 20 stack or the refractory metal layer 18/optional SiN layer 19/second metal layer 20 stack comprise the metal containing layer 16.

For simplicity and ease of understanding, the first embodiment refractory metal layer 18 metal containing layer 16 will be illustrated and specifically described in the balance of the description. It is noted that the alternate embodiment refractory metal layer 18/second metal layer 20 stack or the refractory metal layer 18/optional SiN layer 19/second metal layer 20 stack may be substituted for the first embodiment refractory metal layer 18 metal containing layer 16 in the following description.

Formation of Patterned Masking Layer 22 Over Metal Containing Layer 16

Figure 4:
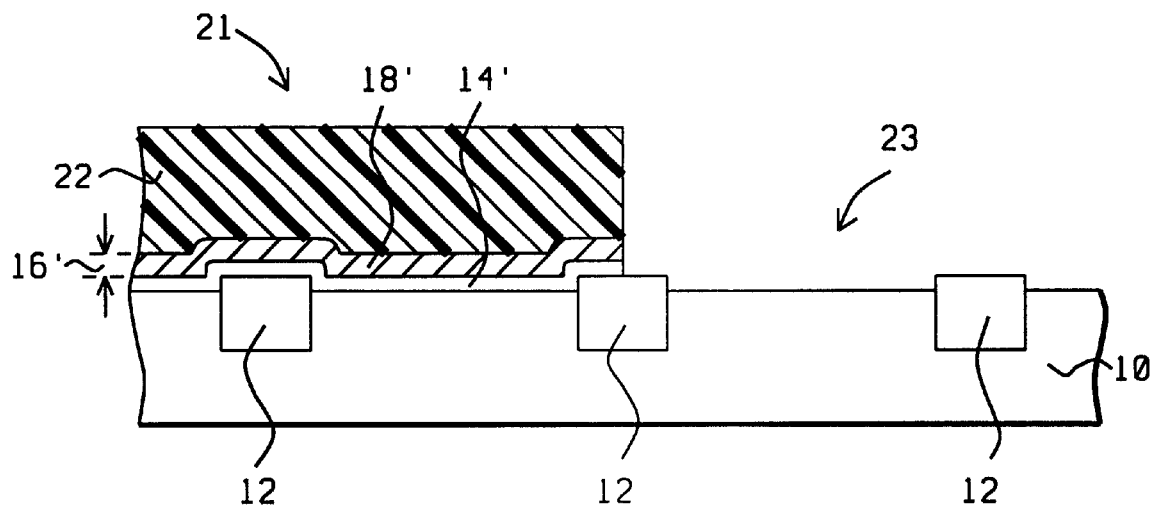

As shown in FIG. 4, a patterned masking layer 22 is formed over metal containing layer 16 at least within the core device region(s) 21 leaving exposed a portion of the metal containing layer 16 within the I/O region(s).

Patterned masking layer 22 is preferably comprised of photoresist SiON or SiO$_2$ and is more preferably comprised of photoresist as shown in FIG. 4.

Then, using the patterned masking layer 22 as a mask, the metal containing layer 16 is patterned, exposing the silicon substrate 10 within at least the I/O region(s) 23. It is noted that at least portions of the isolation regions 12 adjacent the I/O region(s) 23 are also exposed as shown in FIG. 4.

Removal of Patterned Masking Layer 22

Figure 5:
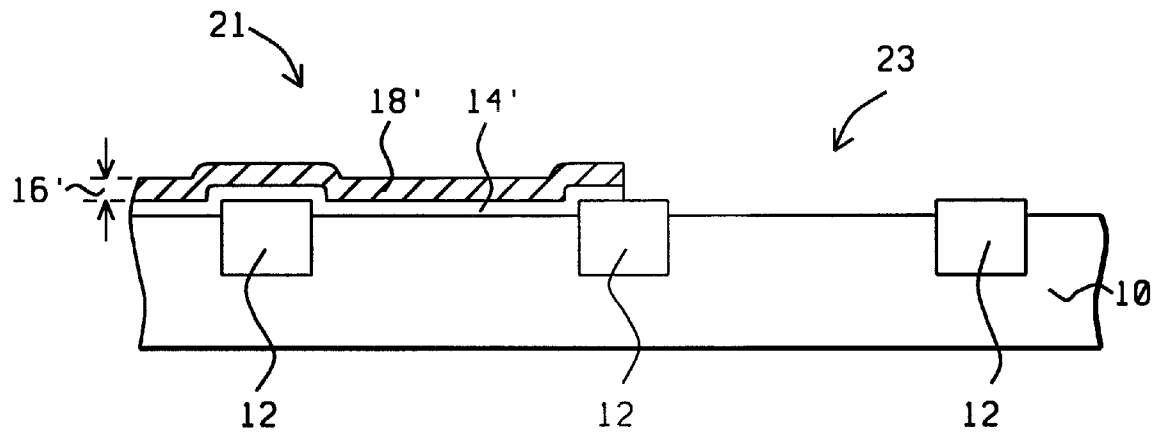

As shown in FIG. 5, the patterned masking layer 22 is removed from the patterned metal containing layer 16' exposing the remaining metal containing layer 16' at least within the core device region(s) 21.

Oxidation to Form Metal Oxide Dielectric Layer 16" Within the Core Device Region(s) 21 and Silicon Oxide Dielectric Layer 26 Within the I/O Region(s) 23

Figure 6:
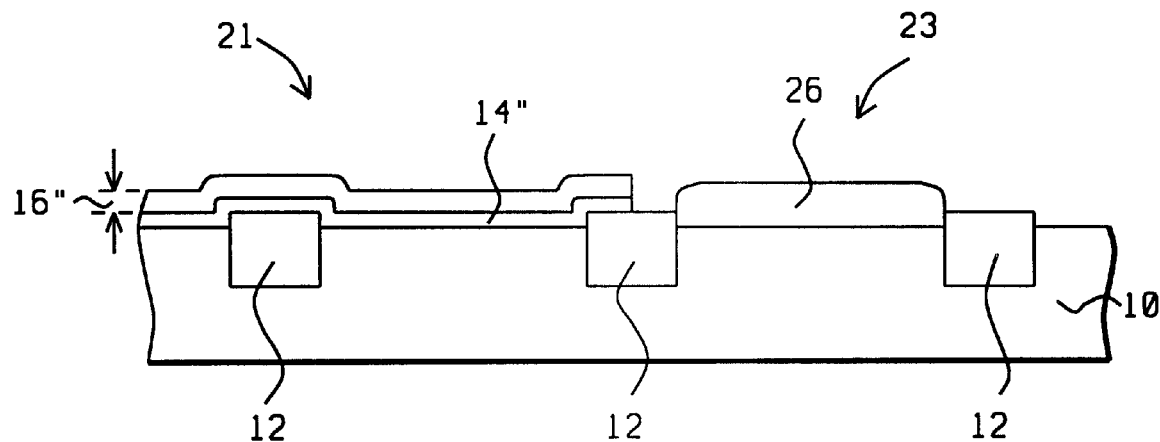

As shown in FIG. 6, the structure of FIG. 5 is subjected to an oxidization process: to convert the patterned metal containing layer 16' to high-k metal oxide gate dielectric layer 16" within the core device region(s) 21; and to form a SiO$_2$ gate dielectric layer 26 over the remaining silicon substrate 10 within the I/O device region(s) 23.

Preferably, patterned buffer layer 14' is fully oxidized by the oxidation process to lessen mobility degradation of the active device(s) subsequently formed over the high-k metal oxide gate dielectric layer 16". Further, all the I/O SiO$_2$ gate dielectric layers 26 are formed by one oxidation step to prevent photoresist remaining issues.

SiO$_2$ gate dielectric layer 26 has a thickness of preferably from about 20 to 100 Å and more preferably from about 32 to 70 Å. High-k metal oxide gate dielectric layer 16" has a thickness of preferably from about 30 to 100 Å and more preferably from about 30 to 50 Å. High-k metal oxide gate dielectric layer 16" has an equivalent oxide thickness (EOT) that is preferably less than or equal to 15 Å, and is more preferably equal of from about 5 to 10 Å. High-k metal oxide gate dielectric layer 16" has an actual thickness of preferably from about 10 to 100Å.

SiO$_2$ gate dielectric layer 26 has a dielectric constant (k) of about 3.9. High-k metal oxide gate dielectric layer 16" has a dielectric constant greater than about 3.9 and is more preferably from about 20 to 50 and most preferably from about 20 to 30.

Further processing may then continue (not shown) to form core device(s) over the

ADVANTAGES OF THE PRESENT INVENTION

The advantages of one or more embodiments of the present invention include:

1. I/O dielectric oxide layers are formed by one oxidation step to prevent photoresist remaining issues;
2. metal diffusion into the substrate can be prevented through the use of a SiN/SiON buffer layer;
3. mobility degradation can be lessened by fully oxidizing the SiN/SiON buffer layer within the core device region(s); and
4. dual-gate dielectrics with differing EOTs may be achieved at the same time.

While particular embodiments of the present invention have been illustrated and described, it is not intended to limit the invention, except as defined by the following claims.

We claim:

1. A method of simultaneously forming a high-k metal oxide dielectric layer and a gate oxide dielectric layer, comprising the steps of:

providing a structure having isolation regions which separate the structure into at least one core device active region and one I/O active region;

forming a buffer layer over the structure and the isolation regions;

forming a metal containing layer over the buffer layer;

patterning the metal containing layer and the buffer layer to:

form an exposed patterned metal containing layer within the at least one core device action region; and expose the structure within the at least one I/O active region; and oxidizing the exposed patterned metal containing layer and the exposed structure within the at least one I/O active region to simultaneously form:

the high-k metal oxide dielectric layer within the at least one core device active region; and the gate oxide dielectric layer within the at least one I/O active region.

2. The method of claim 1, wherein the structure is a silicon substrate and the isolation regions are STI structures or field oxidation structures.

3. The method of claim 1, wherein the buffer layer is SiN or SiON; and the metal containing layer is comprised of: a refractory metal layer; or a refractory metal layer/SiN layer/second metal layer stack.

4. The method of claim 1, wherein the buffer layer is SiN or SiON; the metal containing layer is comprised of a refractory metal layer or a refractory metal layer/SiN layer/second metal layer stack; the refractory metal layers comprised of a material selected from the group consisting of: Ta, Zr, Hf and W; and the second metal layer is comprised of a material selected from the group consisting of: Al, Cu, Au and Ti.

5. The method of claim 1, wherein the buffer layer is SiN or SiON; the metal containing layer is comprised of a refractory metal layer, a refractory metal layer/second metal layer stack or a refractory metal layer/SiN layer/second metal layer stack; the refractory metal layers comprised of a material selected from the group consisting of: Ta, Zr and Hf; and the second metal layer is comprised of Al.

6. The method of claim 1, wherein the structure is a silicon substrate and includes a surface, and the buffer layer is formed by nitridizing the silicon substrate surface with $NH_3$ or $NO/N_2O$ with rapid thermal processing.

7. The method of claim 1, wherein the buffer layer is from about 4 to 6 Å thick; the high-k metal oxide dielectric layer is from about 10 to 100 Å thick; and the gate oxide dielectric layer is from about 20 to 100 Å thick.

8. The method of claim 1, wherein the buffer layer is about 5 Å thick and the gate oxide dielectric layer is from about 32 to 70 Å thick.

9. The method of claim 1, wherein the metal containing layer is patterned by:
   forming a patterned masking layer over the metal containing layer;
   using the patterned masking layer as a mask, patterning the metal containing layer to:
      form an exposed patterned metal containing layer within the at least one core device action region; and
      expose the structure within the at least one I/O active region; and
   removing the patterned masking layer.

10. The method of claim 1, wherein the metal containing layer is patterned by:
    forming a patterned masking layer over the metal containing layer;
    using the patterned masking layer as a mask, patterning the metal containing layer to:
       form an exposed patterned metal containing layer within the at least one core device action region; and
       expose the structure within the at least one I/O active region; and
    removing the patterned masking layer;
the patterned masking layer being comprised of a material selected from the group consisting of: photoresist, SiON and $SiO_2$.

11. The method of claim 1, wherein the high-k metal oxide dielectric layer has a dielectric constant of greater than 3.9 and the gate oxide dielectric layer has a dielectric constant of 3.9.

12. The method of claim 1, wherein the high-k metal oxide dielectric layer has a dielectric constant of from about 20 to 50 and the gate oxide dielectric layer has a dielectric constant of 3.9.

13. The method of claim 1, wherein the high-k metal oxide dielectric layer has a dielectric constant of from about 20 to 30 and the gate oxide dielectric layer has a dielectric constant of 3.9.

14. The method of claim 1, wherein the high-k metal oxide dielectric layer has an equivalent oxide thickness of less than or equal to 15 Å.

15. The method of claim 1, wherein the high-k metal oxide dielectric layer has an equivalent oxide thickness of from about 5 to 10 Å.

16. A method of simultaneously forming a high-k metal oxide dielectric layer and a gate oxide dielectric layer, comprising the steps of:
    providing a silicon substrate having isolation regions which separate the silicon substrate into at least one core device active region and one I/O active region;
    forming a buffer layer over the silicon substrate and the isolation regions; the buffer layer being comprised of SiN or SiON;
    forming a metal containing layer over the buffer layer;
    patterning the metal containing layer and the buffer layer to:
       form an exposed patterned metal containing layer within the at least one core device action region; and
       expose the silicon substrate within the at least one I/O active region; and
    oxidizing the exposed patterned metal containing layer and the exposed silicon substrate within the at least one I/O active region to simultaneously form:
       the high-k metal oxide dielectric layer within the at least one core device active region; and
       the gate oxide dielectric layer within the at least one I/O active region.

17. The method of claim 16, wherein the isolation regions are STI structures or field oxidation structures.

18. The method of claim 16, wherein the metal containing layer is comprised of: a refractory metal layer, a refractory metal layer/second metal layer stack or a refractory metal layer/SiN layer/second metal layer stack.

19. The method of claim 16, wherein the metal containing layer is comprised of a refractory metal layer, a refractory metal layer/second metal layer stack or a refractory metal layer/SiN layer/second metal layer stack; the refractory metal layers comprised of a material selected from the group consisting of: Ta, Zr, Hf and W; and the second metal layer is comprised of a material selected from the group consisting of: Al, Cu, Au and Ti.

20. The method of claim 16, wherein the metal containing layer is comprised of a refractory metal layer, a refractory metal layer/second metal layer stack or a refractory metal layer/SiN layer/second metal layer stack; the refractory metal layers comprised of a material selected from the group consisting of: Ta, Zr and Hf; and the second metal layer is comprised of Al.

21. The method of claim 16, wherein the silicon substrate includes a surface, and the buffer layer is formed by nitridizing the silicon substrate surface with $NH_3$ or $NO/N_2O$ with rapid thermal processing.

22. The method of claim 16, wherein the buffer layer is from about 4 to 6 Å thick; the high-k metal oxide dielectric layer is from about 10 to 100Å thick; and the gate oxide dielectric layer is from about 20 to 100 Å thick.

23. The method of claim 16, wherein the buffer layer is about 5 Å thick; and the gate oxide dielectric layer is from about 32 to 70 Å thick.

24. The method of claim 16, wherein the metal containing layer is patterned by:
    forming a patterned masking layer over the metal containing layer;
    using the patterned masking layer as a mask, patterning the metal containing layer to:
       form an exposed patterned metal containing layer within the at least one core device action region; and
       expose the silicon substrate within the at least one I/O active region; and
    removing the patterned masking layer.

25. The method of claim 16, wherein the metal containing layer is patterned by:
    forming a patterned masking layer over the metal containing layer;
    using the patterned masking layer as a mask, patterning the metal containing layer to:
       form an exposed patterned metal containing layer within the at least one core device action region; and
       expose the silicon substrate within the at least one I/O active region; and
    removing the patterned masking layer;
the patterned masking layer being comprised of a material selected from the group consisting of: photoresist, SiON and $SiO_2$.

26. The method of claim 16, wherein the high-k metal oxide dielectric layer has a dielectric constant of greater than 3.9 and the gate oxide dielectric layer has a dielectric constant of 3.9.

27. The method of claim 16, wherein the high-k metal oxide dielectric layer has a dielectric constant of from about 20 to 50 and the gate oxide dielectric layer has a dielectric constant of 3.9.

28. The method of claim 16, wherein the high-k metal oxide dielectric layer has a dielectric constant of from about 20 to 30 and the gate oxide dielectric layer has a dielectric constant of 3.9.

29. The method of claim 16, wherein the high-k metal oxide dielectric layer has an equivalent oxide thickness of less than or equal to 15 Å.

30. The method of claim 16, wherein the high-k metal oxide dielectric layer has an equivalent oxide thickness of from about 5 to 10 Å.

31. A method of simultaneously forming a high-k metal oxide dielectric layer and a gate oxide dielectric layer, comprising the steps of:
  providing a silicon substrate having isolation regions which separate the silicon substrate into at least one core device active region and one I/O active region;
  forming a buffer layer over the silicon substrate and the isolation regions; the buffer layer being comprised of SiN or SiON;
  forming a metal containing layer over the buffer layer;
  forming a patterned masking layer over the metal containing layer;
  using the patterned masking layer as a mask, patterning the, metal containing layer to:
    form a patterned metal containing layer within the at least one core device action region; and
    expose the silicon substrate within the at least one I/O active region;
  removing the patterned masking layer to exposed the patterned metal containing layer within the at least one core device action region;
  patterning the metal containing layer and the buffer layer to:
    form an exposed patterned metal containing layer within the at least one core device action region; and
    expose the silicon substrate within the at least one I/O active region; and
  oxidizing the exposed patterned metal containing layer and the exposed silicon substrate within the at least one I/O active region to simultaneously form:
    the high-k metal oxide dielectric layer within the at least one core device active region; and
    the gate oxide dielectric layer within the at least one I/O active region.

32. The method of claim 31, wherein the isolation regions are STI structures or field oxidation structures.

33. The method of claim 31, wherein the metal containing layer is comprised of: a refractory metal layer; a refractory metal layer/second metal layer stack; or a refractory metal layer/SiN layer/second metal layer stack.

34. The method of claim 31, wherein the metal containing layer is comprised of a refractory metal layer, a refractory metal layer/second metal layer stack or a refractory metal layer/SiN layer/second metal layer stack; the refractory metal layers comprised of a material selected from the group consisting of: Ta, Zr, Hf and W; and the second metal layer is comprised of a material selected from the group consisting of: Al, Cu, Au and Ti.

35. The method of claim 31, wherein the metal containing layer is comprised of a refractory metal layer, a refractory metal layer/second metal layer stack or a refractory metal layer/SiN layer/second metal layer stack; the refractory metal layers comprised of a material selected from the group consisting of: Ta, Zr and Hf; and the second metal layer is comprised of Al.

36. The method of claim 31, wherein the silicon substrate includes a surface, and the buffer layer is formed by nitridizing the silicon substrate surface with $NH_3$ or $NO/N_2O$ with rapid thermal processing.

37. The method of claim 31, wherein the buffer layer is from about 4 to 6 Å thick; the high-k metal oxide dielectric layer is from about 10 to 100 Å thick; and the gate oxide dielectric layer is from about 20 to 100 Å thick.

38. The method of claim 31, wherein the buffer layer is about 5 Å thick and the gate oxide dielectric layer is from about 32 to 70 Å thick.

39. The method of claim 31, wherein the patterned masking layer is comprised of a material selected from the group consisting of: photoresist, SiON and $SiO_2$.

40. The method of claim 31, wherein the high-k metal oxide dielectric layer has a dielectric constant of greater than 3.9 and the gate oxide dielectric layer has a dielectric constant of 3.9.

41. The method of claim 31, wherein the high-k metal oxide dielectric layer has a dielectric constant of from about 20 to 50 and the gate oxide dielectric layer has a dielectric constant of 3.9.

42. The method of claim 31, wherein the high-k metal oxide dielectric layer has a dielectric constant of from about 20 to 30 and the gate oxide dielectric layer has a dielectric constant of 3.9.

43. The method of claim 31, wherein the high-k metal oxide dielectric layer has an equivalent oxide thickness of less than or equal to 15 Å.

44. The method of claim 31, wherein the high-k metal oxide dielectric layer has an equivalent oxide thickness of from about 5 to 10 Å.

* * * * *